(12) United States Patent
Lung et al.

(10) Patent No.: US 12,437,996 B2
(45) Date of Patent: *Oct. 7, 2025

(54) SEMICONDUCTOR PATTERNING AND RESULTING STRUCTURES

(71) Applicant: Taiwan Semiconductor Manufacturing Co., Ltd., Hsinchu (TW)

(72) Inventors: Chun-Ming Lung, Hsinchu (TW); ChunYao Wang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/434,121

(22) Filed: Feb. 6, 2024

(65) Prior Publication Data

US 2024/0177995 A1    May 30, 2024

Related U.S. Application Data

(63) Continuation of application No. 18/072,896, filed on Dec. 1, 2022, now Pat. No. 11,929,254, which is a
(Continued)

(51) Int. Cl.
*H01L 21/033* (2006.01)
*H01L 21/02* (2006.01)
(Continued)

(52) U.S. Cl.
CPC .... *H01L 21/0332* (2013.01); *H01L 21/02164* (2013.01); *H01L 21/0337* (2013.01);
(Continued)

(58) Field of Classification Search
None
See application file for complete search history.

(56) References Cited

U.S. PATENT DOCUMENTS 9,847,221 B1 * 12/2017 McLaughlin ......... C23C 16/402
11,521,856 B2 * 12/2022 Lung ................. H01L 21/02211
(Continued)

FOREIGN PATENT DOCUMENTS

KR    20090004172 A      1/2009
KR    20090067607   *    6/2009   ........... H01L 21/308
(Continued)

OTHER PUBLICATIONS

D.R. Cote et al., Plasma-assisted chemical vapor deposition of dielectric films for ULSI semiconductor circuits, IBM Journal of Research and Development, vol. 43, pp. 5-38. (Year: 1999).*
(Continued)

*Primary Examiner* — Jiong-Ping Lu
(74) *Attorney, Agent, or Firm* — Slater Matsil, LLP

(57) ABSTRACT

A method includes depositing a hard mask over a target layer. Depositing the hard mask includes depositing a first hard mask layer having a first density and depositing a second hard mask layer over the first hard mask layer, the second hard mask layer having a second density greater than the first density. The method further includes forming a plurality of mandrels over the hard mask; depositing a spacer layer over and along sidewalls of the plurality of mandrels; patterning the spacer layer to provide a plurality of spacers on the sidewalls of the plurality of mandrels; after patterning the spacer layer, removing the plurality of mandrels; transferring a patterning the plurality of spacers to the hard mask; and patterning the target layer using the hard mask as a mask.

20 Claims, 12 Drawing Sheets

Related U.S. Application Data continuation of application No. 17/151,973, filed on Jan. 19, 2021, now Pat. No. 11,521,856.

(60) Provisional application No. 63/085,202, filed on Sep. 30, 2020.

(51) Int. Cl.
| | |
|---|---|
| *H01L 21/302* | (2006.01) |
| *H01L 21/3065* | (2006.01) |
| *H01L 21/308* | (2006.01) |
| *H01L 21/311* | (2006.01) |
| *H01L 21/3213* | (2006.01) |
| *H10D 84/01* | (2025.01) |
| *H10D 84/03* | (2025.01) |

(52) U.S. Cl.
CPC ........ *H01L 21/0338* (2013.01); *H01L 21/302* (2013.01); *H01L 21/3065* (2013.01); *H01L 21/308* (2013.01); *H01L 21/3081* (2013.01); *H01L 21/3086* (2013.01); *H01L 21/3088* (2013.01); *H01L 21/31116* (2013.01); *H01L 21/32139* (2013.01); *H10D 84/0158* (2025.01); *H10D 84/038* (2025.01); *Y10S 438/947* (2013.01)

(56) References Cited

U.S. PATENT DOCUMENTS

| | | | |
|---|---|---|---|
| 11,929,254 B2* | 3/2024 | Lung | H01L 29/42392 |
| 2006/0264001 A1* | 11/2006 | Tran | H10B 41/00 |
| | | | 257/797 |
| 2010/0092891 A1* | 4/2010 | Tran | H01L 21/0337 |
| | | | 430/319 |
| 2013/0095652 A1 | 4/2013 | Harada et al. | |
| 2013/0309838 A1 | 11/2013 | Wei et al. | |
| 2015/0093899 A1 | 4/2015 | Huang et al. | |
| 2015/0294976 A1 | 10/2015 | Kim et al. | |
| 2017/0059995 A1 | 3/2017 | Furutani et al. | |
| 2018/0005832 A1 | 1/2018 | Liao et al. | |
| 2018/0330951 A1* | 11/2018 | Kulshreshtha | H01L 21/2257 |
| 2019/0157456 A1 | 5/2019 | Chen et al. | |
| 2019/0371678 A1 | 12/2019 | Song et al. | |

FOREIGN PATENT DOCUMENTS

| | | |
|---|---|---|
| KR | 20090067607 A | 6/2009 |
| WO | 2015190174 A1 | 12/2015 |

OTHER PUBLICATIONS

M. Iwaki, "Estimation of the atomic density of amorphous carbon using ion implantation, SIMS, and RBS", Surface and Coatings Technology, vol. 158-159, pp. 377-318 (Year: 2002).*

* cited by examiner

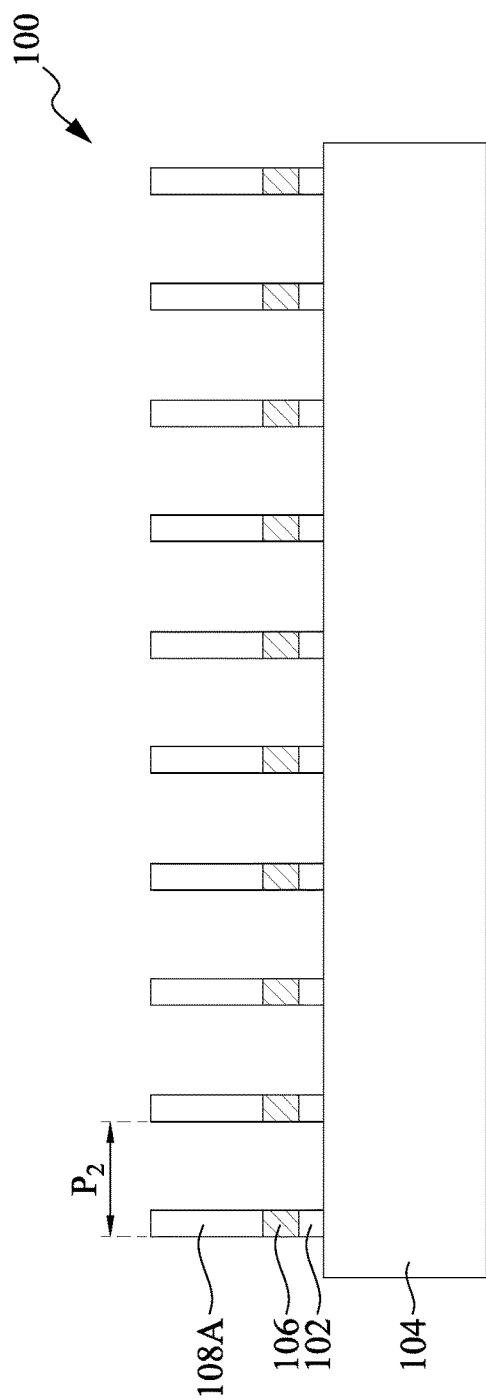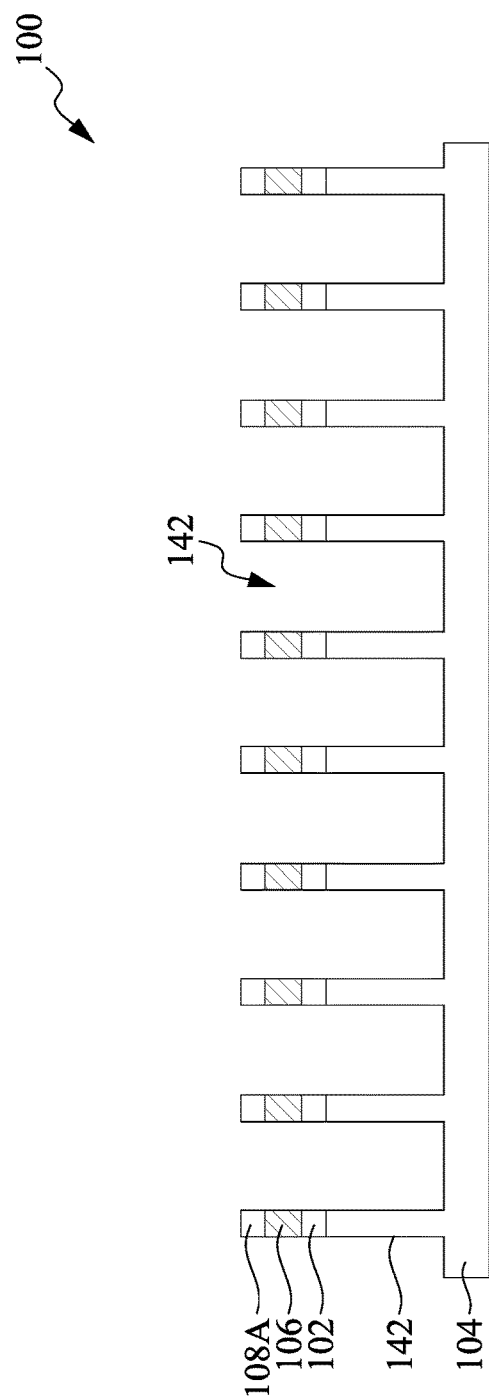

SEMICONDUCTOR PATTERNING AND RESULTING STRUCTURES

PRIORITY CLAIM AND CROSS-REFERENCE

This application is a continuation of U.S. application Ser. No. 18/072,896, filed Dec. 1, 2022, now U.S. Pat. No. 11,929,254, issued on Mar. 12, 2024, which is a continuation of U.S. application Ser. No. 17/151,973, filed on Jan. 19, 2021, now U.S. Pat. No. 11,521,856, issued on Dec. 6, 2022, which claims the benefit of U.S. Provisional Application No. 63/085,202, filed on Sep. 30, 2020, which application is hereby incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3, 4, 5, 6, 7A, 7B, 8, 9, and 10 illustrate cross-sectional and perspective views of various intermediary stages of manufacturing a semiconductor device according to various embodiments.

DETAILED DESCRIPTION

Figure 1:
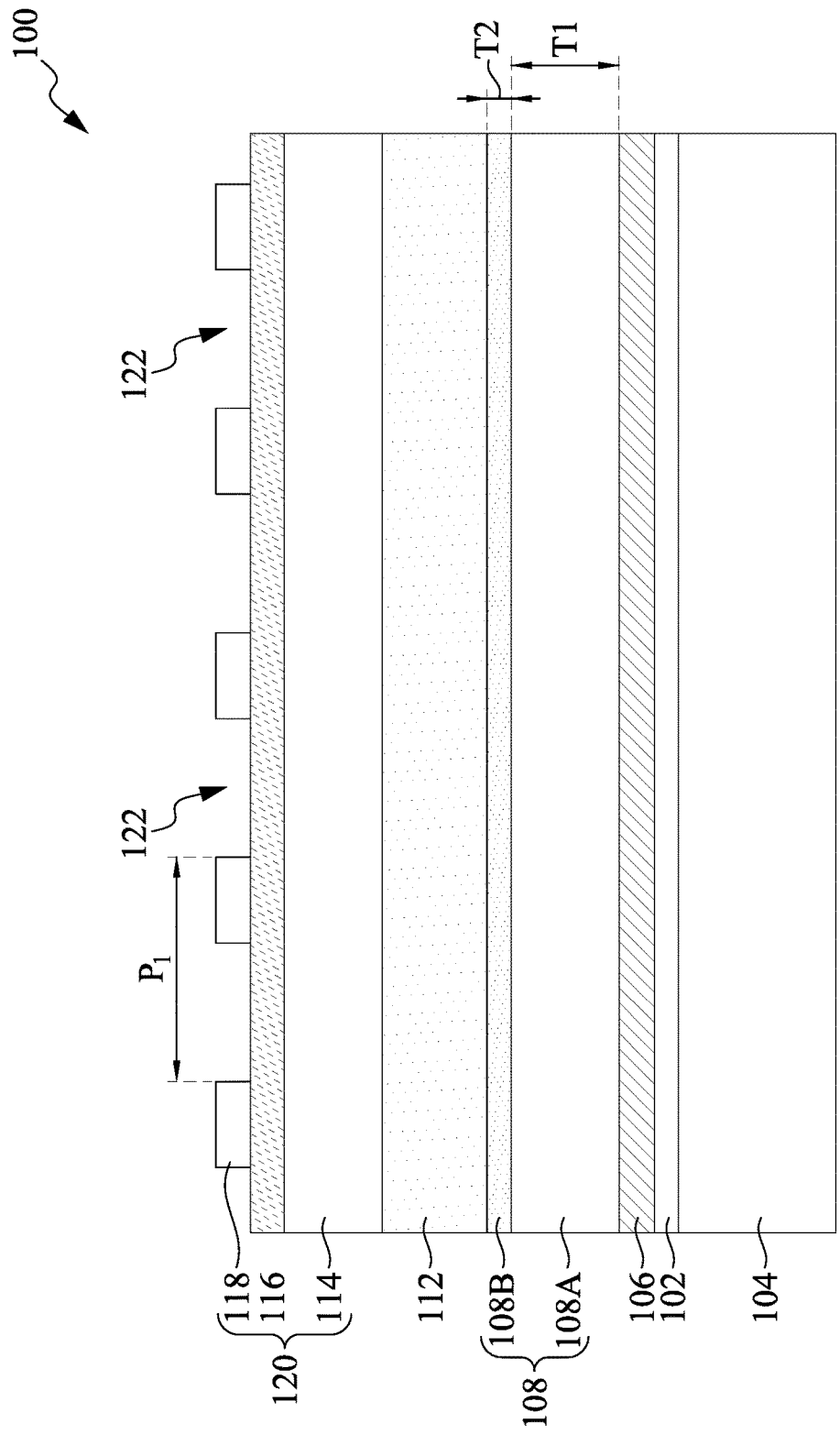

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in respect to a specifically patterning process, namely a self-aligned double patterning (SADP) process where mandrels are patterned, spacers are formed along sidewalls of the mandrels, and the mandrels are removed leaving the spacers to define a pattern at half a pitch of the mandrels. However, various embodiments may be directed at other patterning processes, such as, self-aligned quadruple patterning (SAQP), and the like.

A semiconductor device and method are provided in accordance with some embodiments. In particular, a self-aligned double patterning process is performed to pattern features (e.g., semiconductor fins, gate structures, conductive lines, or the like) into a target layer of in a semiconductor device. The patterned features have a pitch that is at least one half of a minimum pitch achievable using photolithographic processes. In various embodiments, a multilayered oxide is used as a hard mask over the target layer during the patterning process. The multilayered oxide hard mask may include a first oxide layer and a second oxide layer over the first oxide layer. A density of the second oxide layer may be greater than the first oxide layer. Advantages may be achieved using embodiment multilayered hard masks. For example, the relatively dense, second oxide layer may help reduce oxide loss during patterning and improve critical dimension (CD) control. Further, in embodiments where the double patterning process is used to patterning semiconductor fins, reduced defects (e.g., less bending in the mask layer) and improved fin profile control (e.g., a more uniform profile) may also be achieved. Further, using a relatively less dense first oxide layer may reduce cost and increase yield through the faster deposition time of the first oxide layer compared to the denser second oxide layer.

FIGS. 1 through 10 illustrate cross-sectional views of intermediate stages in the formation of features in a target layer 104 of a semiconductor device 100, in accordance with some exemplary embodiments. The target layer 104 is a layer in which a plurality of patterns is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 104 is a semiconductor substrate. The semiconductor substrate may comprise silicon, doped or undoped, or an active layer of a semiconductor-on-insulator (SOI) substrate. The target layer 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs).

In some embodiments, the target layer 104 is a conductive layer, such as, a metal layer or a polysilicon layer, which is blanket deposited. Embodiment patterning processes may be applied to the target layer 104 in order to pattern semiconductor gates and/or dummy gates of finFETS. By using embodiment processes to pattern a conductive target layer 104, spacing between adjacent gates may be reduced and gate density may be increased. In such embodiments, the target layer 104 may be formed over a semiconductor substrate, e.g., as described above.

In some embodiments, the target layer 104 is an intermetal dielectric (IMD) layer. In such embodiments, the target layer 104 comprises a low-k dielectric material having a dielectric constant (k value) lower than 3.8, lower than about 3.0, or lower than about 2.5, for example. In alternative embodiments, target layer 104 is an IMD layer comprising high-k dielectric material having a k value higher than 3.8. Openings may be patterned in the target layer 104 with the embodiment processes, and conductive lines and/or vias may be formed in the openings. In such embodiments, the target layer may be formed over a semiconductor substrate (e.g., as described above), and devices, such as transistors, diodes, capacitors, resistors, etc., may be formed in and/or on an active surface of semiconductor substrate.

An adhesion layer 102 is deposited over the target layer 104. The adhesion layer 102 may be deposited by physical vapor deposition (PVD), chemical vapor deposition (CVD), atomic layer deposition (ALD), or the like. In some embodiments, the adhesion layer 102 may function as adhesion layer and may function as an etch stop layer during subsequent fin formation. Although FIG. 1 illustrates adhesion layer 102 being in physical contact with target layer 104, any number of intervening layers may be disposed between adhesion layer 102 and target layer 104.

The film stack further includes a hard mask layer 106 formed over the adhesion layer 102. The hard mask layer 106 may be formed of a material that may be etched electively compared to the adhesion layer 102. For example, in embodiments where the adhesion layer 102 comprises an oxide, the hard mask layer 106 may be nitride, such as, silicon nitride, or the like. The hard mask layer 108 may be deposited, for example, by PVD, CVD, ALD, or the like. In some embodiments, the hard mask layer 106 may have a range of about 200 Å to about 300 Å, for example.

The film stack further includes a multilayered hard mask 108 over the hard mask layer 106. The multilayer hard mask 108 may include a first hard mask layer 108A and a second hard mask layer 108B over the first hard mask layer 108A. In some embodiments, multilayered hard mask 108 may comprise a material that can be selectively etched compared to the hard mask layer 106. For example, in embodiments where the hard mask layer 106 comprises a nitride, the multilayered hard mask 108 may comprise an oxide. Specifically, in some embodiments, the first hard mask layer 108A and the second hard mask layer 108B each comprise silicon oxide (e.g., $SiO_2$ or the like), silicon oxynitride (SiON), silicon oxycarbon nitride (SiOCN), combinations thereof, or the like.

In various embodiments, the second hard mask layer 108B has a higher density than the first hard mask layer 108A. For example, the first hard mask layer 108A has a density in a range of about 1.6 g/cm$^3$ to about 1.8 g/cm$^3$ while the second hard mask layer 108B has a density in a range of about 1.8 g/cm$^3$ to about 2.3 g/cm$^3$. In various embodiments, the second hard mask layer 108B has a density of at least about 1.8 g/cm$^3$. By using a relatively dense (e.g., in the above ranges), top layer in the multilayered hard mask 108, the second hard mask layer 108B may protect underlying features (e.g., the first hard mask layer 108A) during subsequent patterning steps and reduce manufacturing defects. For example, denser materials are less susceptible to etching, and oxide loss of the multilayered hard mask 108 may be achieved, resulting in improved mask bending control, improved critical dimension control, and an improved profile of the patterned features (e.g., fins) in the target 104.

In some embodiments, both the first hard mask layer 108A and the second hard mask layer 108B are deposited using CVD (e.g., such as plasma enhanced CVD (PECVD)). The second hard mask layer 108B may be deposited in-situ (e.g., within a same process chamber in a continuous vacuum environment) with the first hard mask layer 108A. Precursors used during the deposition of both the first hard mask layer 108A and the second hard mask layer 108B may include a silicon-containing gas (e.g., $SiH_4$) and an oxygen-containing gas (e.g., $N_2O$). Other gases, such as carrier gases, may also be present during deposition. In some embodiments, depositing the second hard mask layer 108B may be performed at a higher plasma power and/or at a lower deposition rate than the first hard mask layer 108A so that a density of the second hard mask layer 108B may be greater than the first hard mask layer 108A. For example, a plasma power applied while deposition the second hard mask layer 108B may be in a range of about 400 W to about 800 W, and a plasma power applied while depositing the first hard mask layer 108A may be in a range of about 200 W to about 400 W. As another example, a deposition rate of the second hard mask layer 108B may be in a range of about 10 Å/s to about 30 Å/s, and a deposition rate of the first hard mask layer 108A may be in a range of about 30 Å/s to about 60 Å/s.

In other embodiments, the first hard mask layer 108A may be deposited by CVD (e.g., using the processing parameters described above) while the second hard mask layer 108B is deposited using a different process that is performed ex-situ (e.g., in a different process chamber) as the first hard mask layer 108A. For example, the second hard mask layer 108B may be deposited by atomic layer deposition (ALD). In some embodiments, the ALD process may include flowing a silicon-containing precursor (e.g., $H_2Si[N(C_2H_5)_2]_2$, SAM 24, or the like) and an oxygen-containing precursor (e.g., an oxygen plasma, or the like) into the process chamber to deposit the second hard mask layer 108B. Other gases, such as carrier gases, may also be present during deposition.

In the resulting structure, the second hard mask layer 108B is thinner than the first hard mask layer 108A. For example, the first hard mask layer 108A may have a thickness T1 in a range of about 400 Å to about 1000 Å, and the second hard mask layer 108B may have a thickness T2 in a range of about 50 Å to about 150 Å. Further, a ratio of the thickness T2 to the thickness T1 may be in a range of about 1:6 to about 1:4. It has been observed that when the thickness T1 of the first hard mask layer 108A is less or greater than the above range, a processing time to deposit the mask layer 108 may be too great, and manufacturing costs may be unacceptably large. Further, it has been observed that when the thickness T2 is less than the above range, the second hard mask layer 108B may not sufficiently protect the underlying first hard mask layer 108A during patterning, which results in an unacceptably high level of oxide loss and manufacturing defects.

The film stack further includes a mandrel layer 112 formed over the hard mask 108. The mandrel layer 112 may comprise silicon (e.g., amorphous silicon), or the like. The mandrel layer 112 may be deposited using any suitable process, such as, ALD, CVD, PVD, or the like.

A tri-layer photoresist 120 is formed on the film stack over the mandrel layer 112. The tri-layer photoresist 120 includes a bottom layer 114, a middle layer 116 over the bottom layer 114, and an upper layer 118 over the middle layer 116. The bottom layer 114 and upper layer 118 may be formed of photoresists (e.g., photosensitive materials), which include organic materials. In some embodiments, the bottom layer 114 may also be a bottom anti-reflective coating (BARC) layer. The middle layer 116 may comprise an inorganic material, which may be a nitride (such as silicon nitride), an oxynitride (such as silicon oxynitride), an oxide (such as silicon oxide), or the like. The middle layer 116 has a high etching selectivity relative to the upper layer 118 and the bottom layer 114. The various layers of the tri-layer photoresist 120 may be blanket deposited sequentially using, for example, spin-on processes. Although a tri-layer photoresist 120 is discussed herein, in other embodiments, the photoresist 120 may be a monolayer or a bilayer (e.g., comprising only the bottom layer 114 and the upper layer 118 without the middle layer 116) photoresist. The type of photoresist used (e.g., monolayer, bilayer, or tri-layer) may depend on the photolithography process used to pattern the mandrel layer 112. For example, in advanced extreme ultraviolet (EUV) lithography processes, a monolayer or bilayer photoresist 120 may be used.

In some embodiments, the upper layer 118 is patterned using a photolithographic process. Subsequently, the upper layer 118 is used as an etching mask for patterning of the middle layer 116 (see FIG. 2). The middle layer 116 is then used as an etching mask for patterning of the bottom layer 114, and the bottom layer 114 is then used to pattern the mandrel layer 112 (see FIGS. 3 and 4). It has been observed that by using a tri-layer photoresist (e.g., tri-layer photoresist 120) to etch a target layer (e.g., mandrel layer 112), improved definition in fine-pitched patterns can be achieved in the target layer (e.g., mandrel layer 112).

The upper layer 118 is patterned using any suitable photolithography process to form openings 122 therein. As an example of patterning openings 122 in the upper layer 118, a photomask may be disposed over the upper layer 118. The upper layer 118 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 118. Exposure of the top photoresist layer may be performed using an immersion lithography system to increase resolution and decrease the minimum achievable pitch. A bake or cure operation may be performed to harden the upper layer 118, and a developer may be used to remove either the exposed or unexposed portions of the upper layer 118 depending on whether a positive or negative resist is used. The pitch $P_1$ of the openings 122 may be the minimum pitch achievable using photolithographic processes alone. For example, in some embodiments, the pitch $P_1$ of the openings 122 is about 80 nm or less or even about 28 nm or less. Other pitches $P_1$ of the openings 122 are also contemplated.

Figure 2:
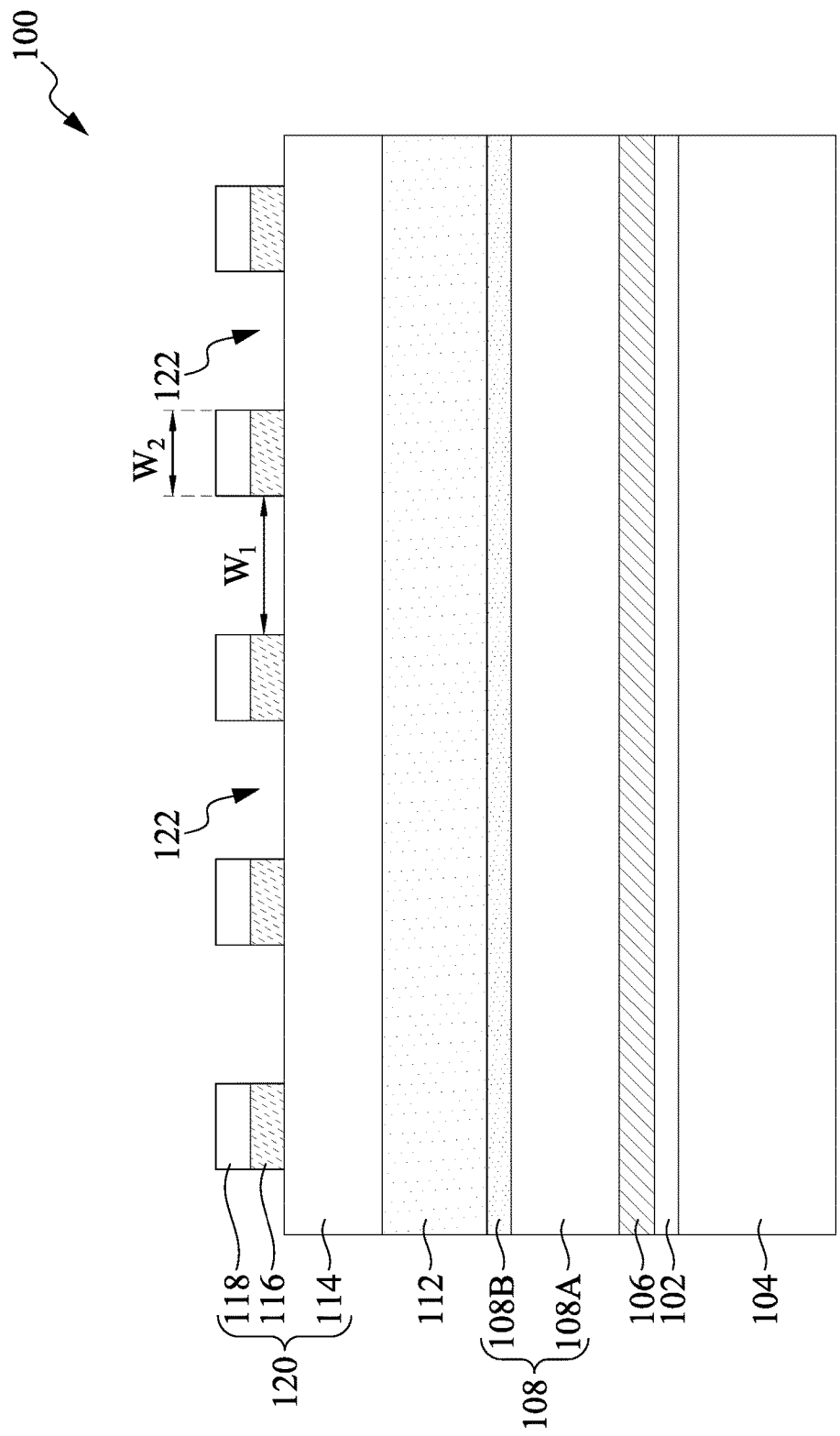

After the patterning of the upper layer 118, the pattern of the upper layer 118 is transferred to the middle layer 116 in an etching process. The etching process is anisotropic, so that the openings 122 in the upper layer 118 are extended through the middle layer 116 and have about the same sizes in the middle layer 116 as they do in the upper layer 118. The resulting structure is illustrated in FIG. 2.

Optionally, a trimming process may be performed to increase the size of the openings 122 in the middle layer 116. In an embodiment, the trimming process is an anisotropic plasma etch process with process gases including $O_2$, $CO_2$, $N_2/H_2$, $H_2$, the like, a combination thereof, or any other gases suitable for trimming the middle layer 116. The trimming may increase the width $W_1$ of the openings 122 and decrease the width $W_2$ of the portions of the middle layer 116 between the openings 122. For example, in some embodiments, after trimming, the width $W_2$ may be 20 nm or less. The trimming process may be performed in order to achieve a desired ratio of the width $W_1$ to the width $W_2$ so that subsequently defined structures are uniformly spaced. In other embodiments, the middle layer 116 is initially patterned to have a desired ratio of the width $W_1$ to the width $W_2$ and the trimming process may be omitted.

Figure 3:
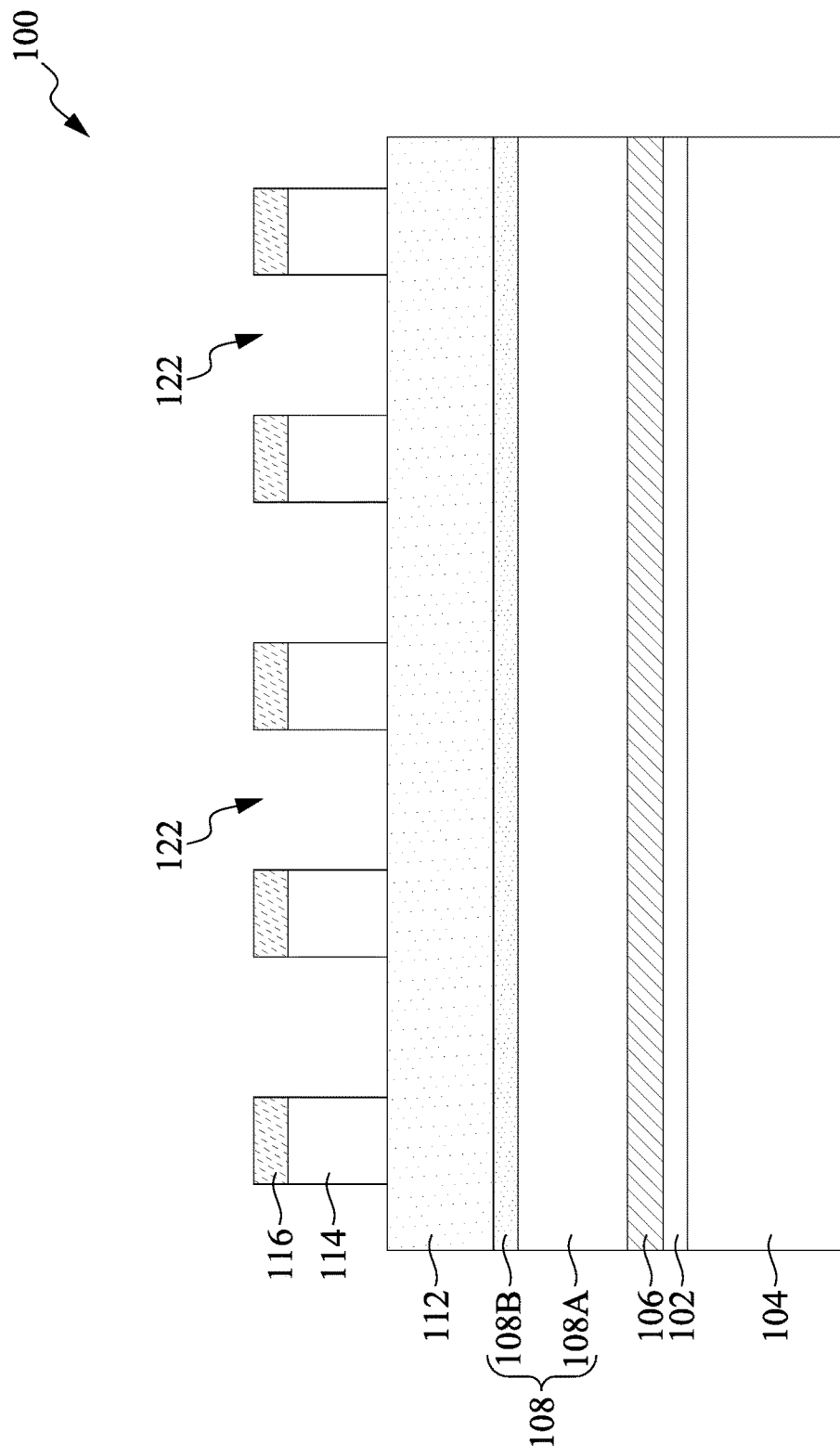

In FIG. 3, an etching process is performed to transfer the pattern of the middle layer 116 to the bottom layer 114, thereby extending the openings 122 through the bottom layer 114. The etching process of the bottom layer 114 is anisotropic, so that the openings 122 in the middle layer 116 are extended through the bottom layer 114 and have about the same sizes in the middle layer 116 as they do in the bottom layer 114. As part of etching the bottom layer 114, the upper layer 118 (see FIGS. 1 and 2) may be consumed.

Figure 4:
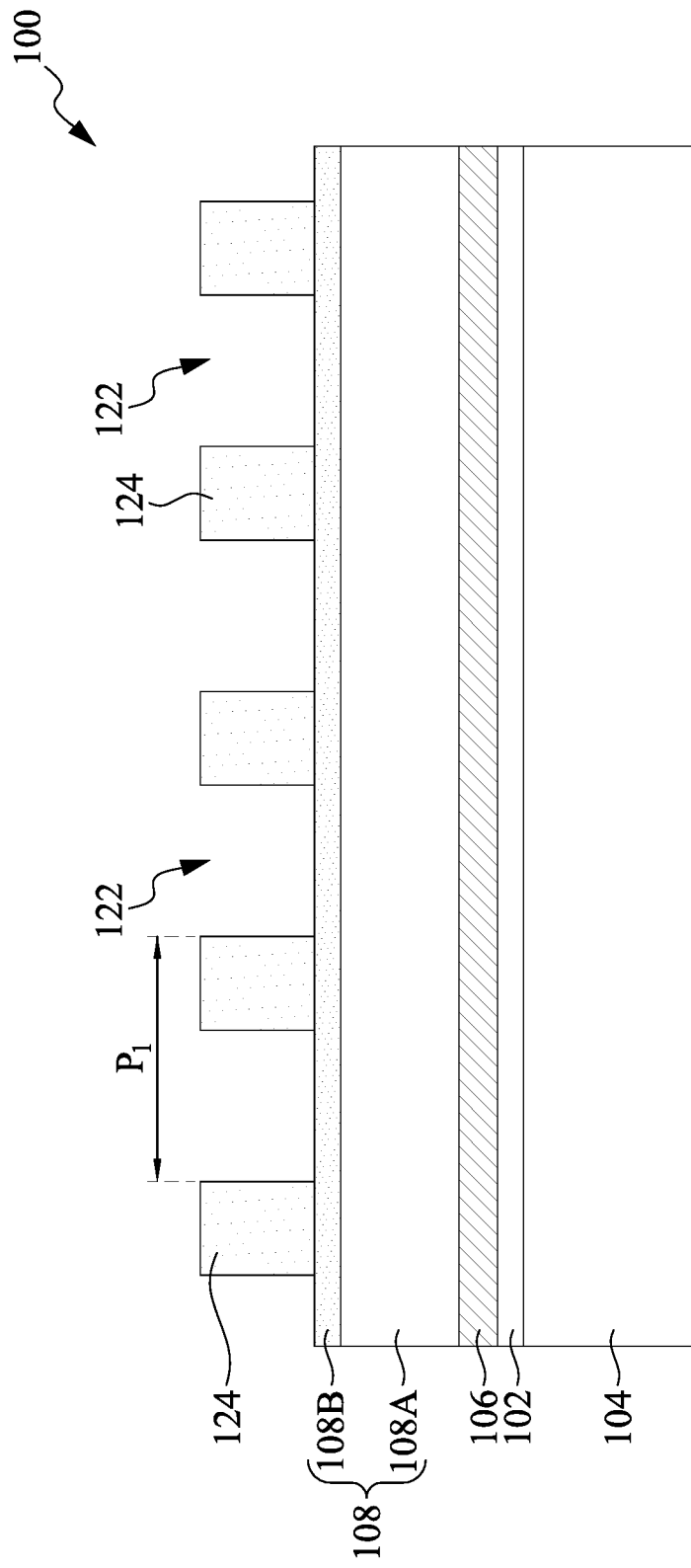

In FIG. 4, the pattern of the bottom layer 114 (see FIG. 3) is transferred to the mandrel layer 112 using an etching process. The etching process of the mandrel layer 112 is anisotropic, so that the openings 122 in the bottom layer 114 are extended through the mandrel layer 112. The openings 122 have about the same widths in the mandrel layer 112 as they do in the bottom layer 114. The etching may be a dry etch (e.g., a plasma etch), or the like.

A layer immediately underlying the mandrel layer 112 (e.g., the hard mask 108) may be used as an etch stop layer when patterning the mandrel layer 112. Specifically, the etching process may use an etchant that selectively etches the mandrel layer 112 without significantly etching the second hard mask layer 108A. For example, in embodiments where the mandrel layer 112 comprises silicon and the hard mask layer comprises silicon oxide, the etching process may use HBr, $CF_4$, $Cl_2$, $NF_3$, or the like, as an etchant.

Thus, mandrels 124 are defined from remaining portions of the mandrel layer 112 (e.g., portions of mandrel layer 112 between openings 122). The mandrels 124 have a pitch $P_1$ (see also FIG. 1). In some embodiments, pitch $P_1$ is a minimum pitch achievable using photolithographic processes. Further, each mandrel 112 has a width $W_2$, which may be 20 nm or less in some embodiments. During etching the mandrel layer 112, the middle layer 116 is consumed, and bottom layer 114 may be at least partially consumed.

In embodiments when the bottom layer 114 is not completely consumed while etching the mandrel layer 112, an ashing process may be performed to remove remaining residue of the bottom layer 114. The ashing process may comprise an oxygen plasma strip, which exposes the mandrels 124 to oxygen plasma.

Figure 5:
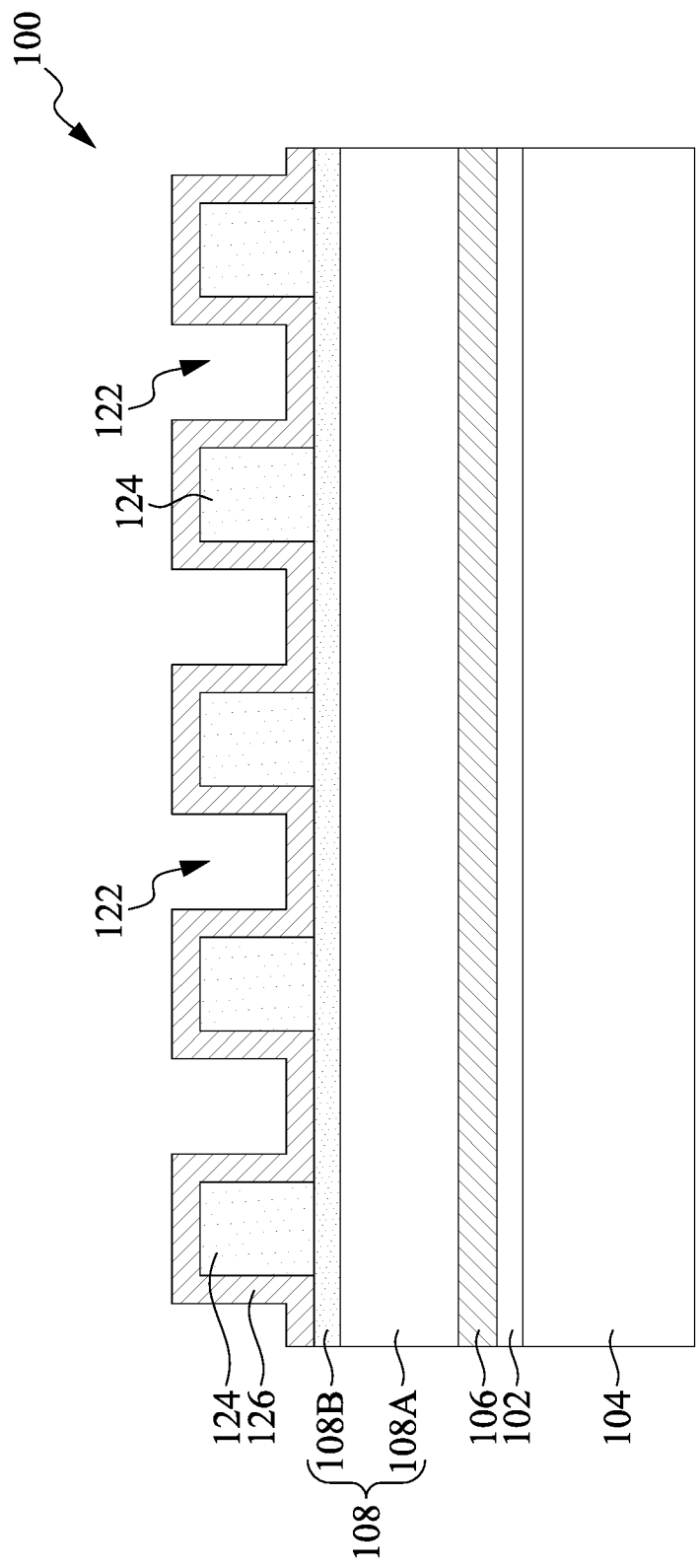

In FIG. 5, a spacer layer 126 is formed over and along sidewalls of the mandrels 124. The spacer layer 126 may further extend along top surfaces of the hard mask 108 in the openings 122. The material of the spacer layer 126 is selected to have a high etching selectivity with the hard mask layer 108 and the mandrels 124. For example, the spacer layer 126 may be comprise SiN, SiCON, SiON, metals, metal alloys, and the like, and may be deposited using any suitable process such as ALD, CVD, or the like. In some embodiments, the deposition process of the spacer layer 126 is conformal so that a thickness of the spacer layer 126 on sidewalls of the mandrels 124 is substantially equal (e.g., within manufacturing tolerances) of a thickness of the spacer layer 126 on the top surface of mandrels 124 and bottom surfaces of the openings 122.

Figure 6:
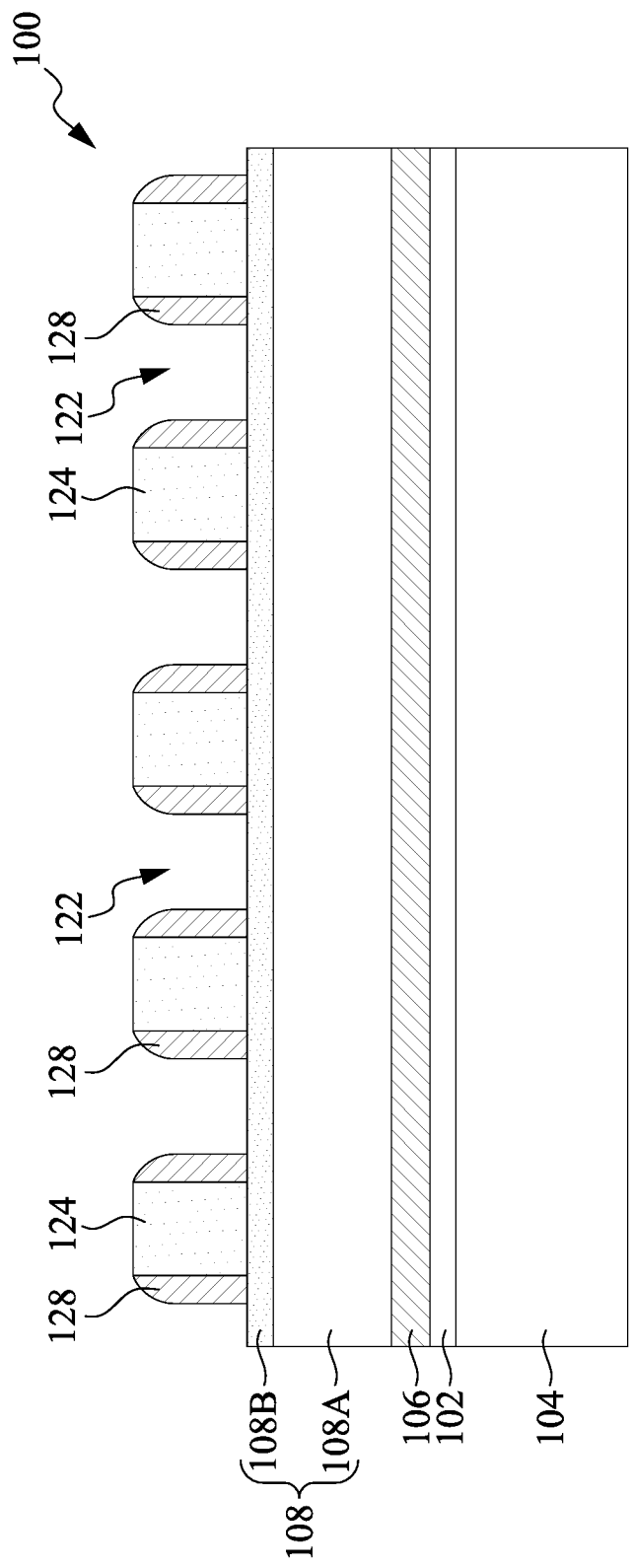

In FIG. 6, the spacer layer 126 is patterned to remove lateral portions of the spacer layer 126 while leaving spacers 128 on sidewalls of the mandrels 124. Etching the spacer layer 126 exposes the mandrels 124 and portions of the layer underlying the mandrels 124 (e.g., the hard mask 108). Patterning the spacer layer 126 may include a dry etch process, which selectively etches the spacer layer 126 at a higher rate than the mandrels 124. Example etchants for etching the spacer layer 126 may include a fluorine reactive gas, such as, $CF_4$, $NF_3$, HCl, HBr, or the like. Other process gases may be used in combination with the etchants, such as, oxygen ($O_2$), nitrogen ($N_2$), argon (Ar), combinations thereof, or the like. The dry etch process may anisotropic and etch exposed, lateral portions of the spacer layer 126 while leaving vertical portions of the spacer layer 126 (the spacers 128) on the mandrels 124.

Figure 7A:
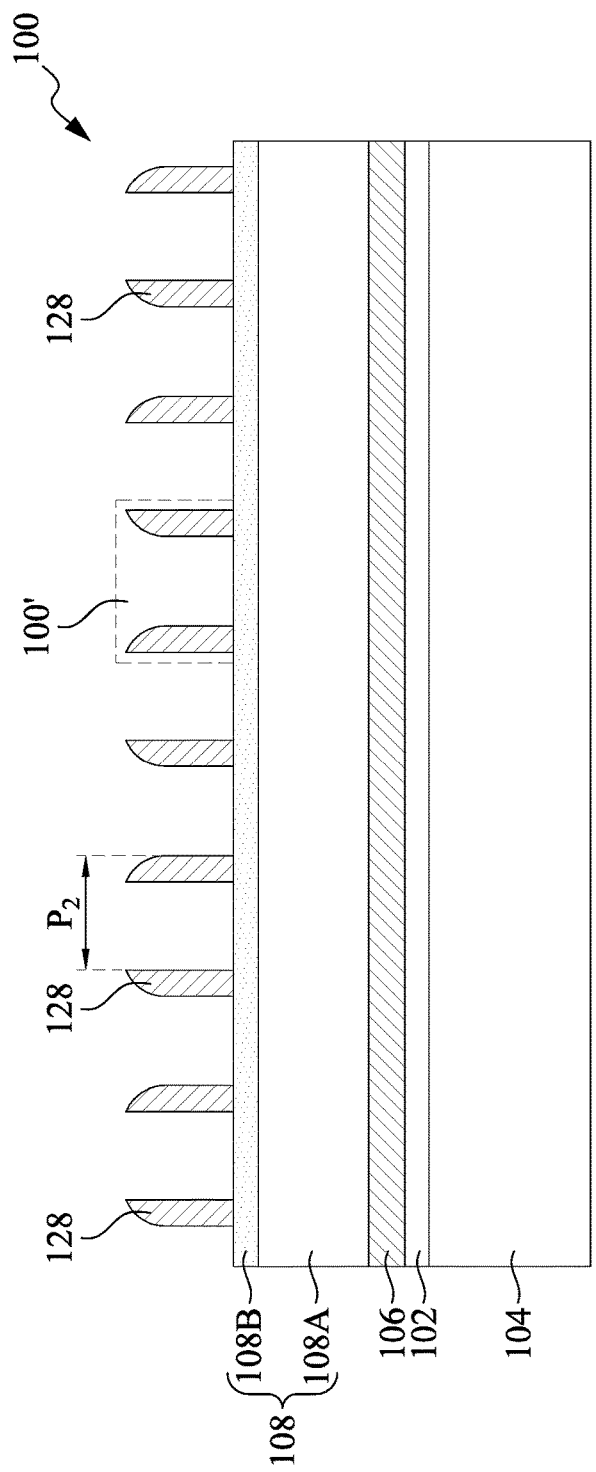

In FIG. 7A, the mandrels 124 are removed using an etching process. Because the mandrels 124 and the spacers 128 have etch selectivity relative a same etch process, the mandrels 124 may be removed without removing the spacers 128. Etching the mandrels 124 exposes the underlying hard mask 108, which may act as an etch stop layer. In some embodiments, etching the mandrels 124 may reduce a height of the spacers 128 without removing the spacers 128. Removing the mandrels 124 may comprise a dry etch process similar to the process used to pattern the mandrels 124 as described above in FIG. 4.

After the mandrels 124 are removed, the spacers 127 may have a pitch $P_2$. In embodiments where a SADP process as described above is employed, pitch $P_2$ is one half of a minimum pitch achievable by photolithographic processes (e.g., the pitch $P_1$). The spacers 128 define a pattern for the hard mask 108. In some embodiments, the spacers 128 correspond to a pattern of semiconductor fins or gate structures that are subsequently patterned into the target layer 104.

Figure 7B:
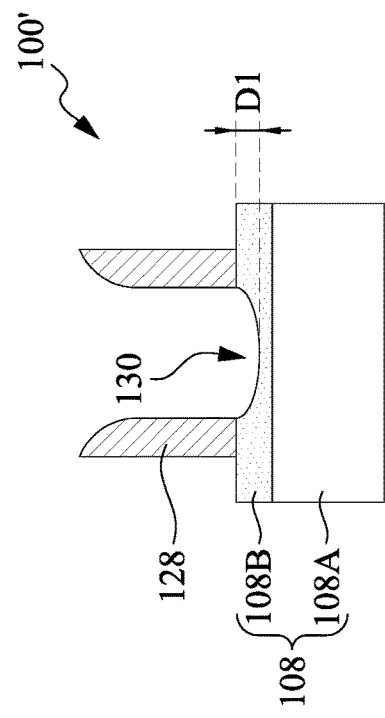

FIG. 7B illustrates a detailed view of region 100' of FIG. 7A. As illustrated in FIG. 7B, the second hard mask layer 108B covers and protects the underlying first hard mask layer 108A from etching while removing the mandrels 124, forming the spacers 128 (see FIG. 6), and patterning the mandrels 124 (see FIG. 4). Because the second hard mask layer 108B is relatively dense, it is less susceptible to etching than the first hard mask layer 108A. As a result, oxide loss can be reduced. For example, recesses 130 may be etched into the second hard mask layer 108B as a result of removing the mandrels 124, forming the spacers 128, and patterning the mandrels 124, and a depth D1 of the recesses 130 may be less than about 3 nm, such as in a range of about 1 nm to about 2 nm. It has been observed that when oxide loss of the underlying mask layer 108 is in the above range (e.g., less than 3 nm), the spacers 128 are relatively straight, and undesirable bending is avoided and a footing of the spacers 128 (e.g., profile of the hard mask 108 around the spacers 128) may be controlled. As a result, fewer manufacturing defects and improved profile/CD control can be achieved when patterning the target layer 104 subsequently.

In FIG. 8, the hard mask 108 is etched using the spacers 128 as an etching mask. Thus, the hard mask 108 may have a same pattern and pitch as the spacers 128. In some embodiments, etching the hard mask 108 comprises an anisotropic dry etch and/or wet etch. For example, the hard mask 108 may be patterned by dry etching (e.g., using $CF_4$, $NF_3$, HCl, HBr, or the like), a subsequent wet etch (e.g., using diluted hydrogen fluoride (DHF), sulfur peroxide mix (SPM), or the like) for by-product removal, and a cleaning process (e.g., standard clean 1 (SC-1) or the like) for particle cleaning. Etching the hard mask 108 may consume the spacers 128, consume the second hard mask layer 108B, and partially consume the first hard mask layer 108A. As a result, after the hard mask layer 108 is etched, only the first hard mask layer 108A may remain, and the spacers 128 and the second hard mask layer 108B may be removed.

Subsequently, in FIG. 9, the hard mask 108 is used as an etching mask to pattern openings 140 in the target layer 104, which may define fins 142. Etching the target layer 104 may comprise an anisotropic dry etch process and/or a wet etch process. Remaining portions of the target layer 104 may have a same pattern as the spacers 128 of FIG. 7A. Patterning the target layer 104 may further consume the hard mask 108, and a height of the first hard mask layer 108A may be reduced. In various embodiments, a profile of the fins 142 may be improved by using a hard mask 108 having two distinct layers of different densities. Specifically, the second had mask layer 108B is relatively dense allows for reduced oxide loss and for the widths of the resulting fins 142 to be patterned with improved uniformity.

Figure 10:
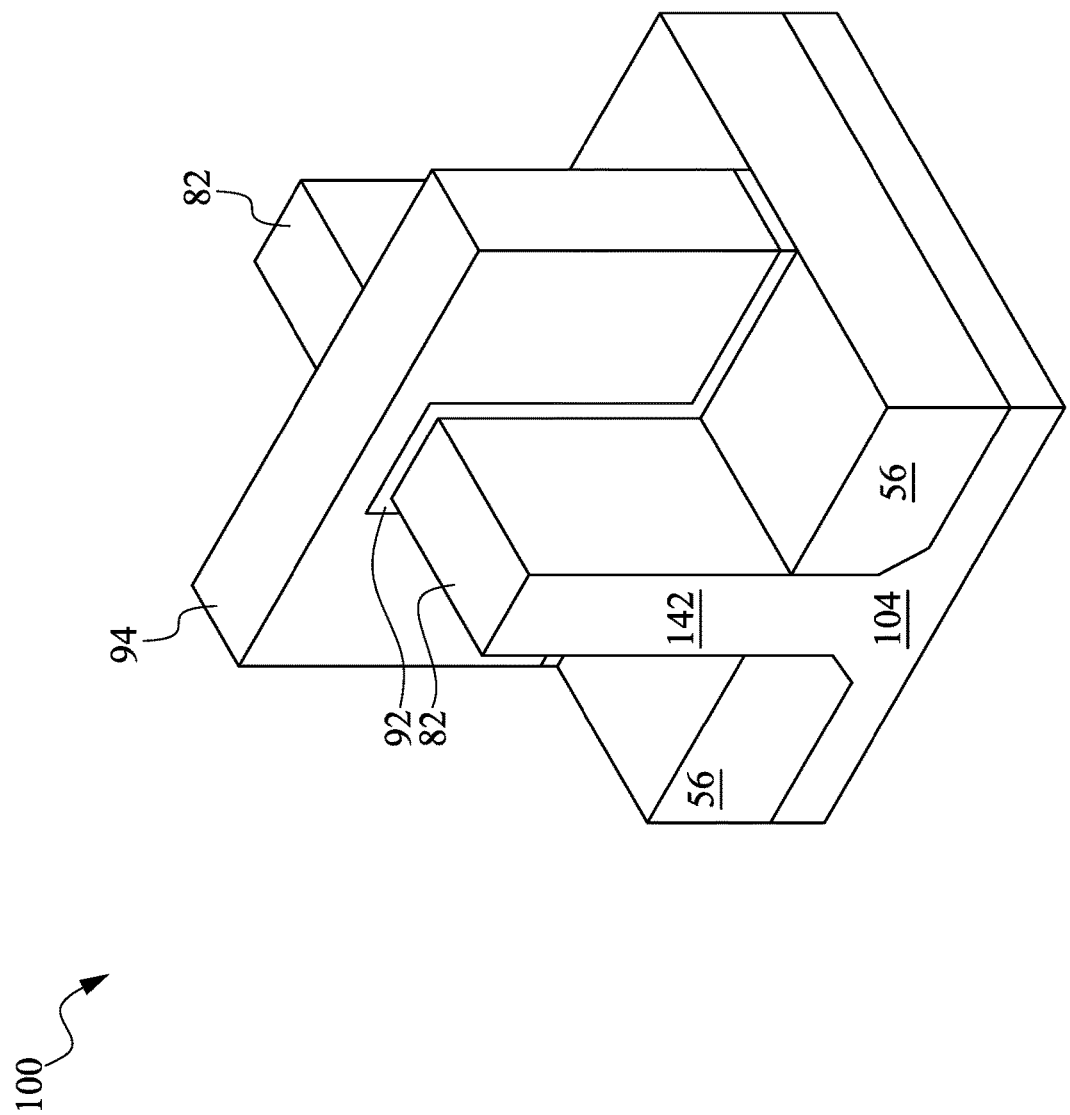

Additional process steps may be applied to structure 100 to form fin field effect transistor (FinFET) devices. For example, isolation regions may be deposited around the fins 142, and the isolation regions may then be recessed to expose upper portions of the fins 142. Openings may be patterned in the upper portions of the fins 142, and epitaxial source/drain regions maybe grown in the openings. Further, gate structures may be formed over and along sidewalls of upper portions of the fins 142. FIG. 10 illustrates an example of a FinFET in a three-dimensional view, in accordance with some embodiments. The FinFET comprises a fin 142, which may be patterned according to the processes described in FIGS. 1-9, above. The fin 142 protrudes above and from between neighboring isolation regions 56. A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94.

Figure 11:
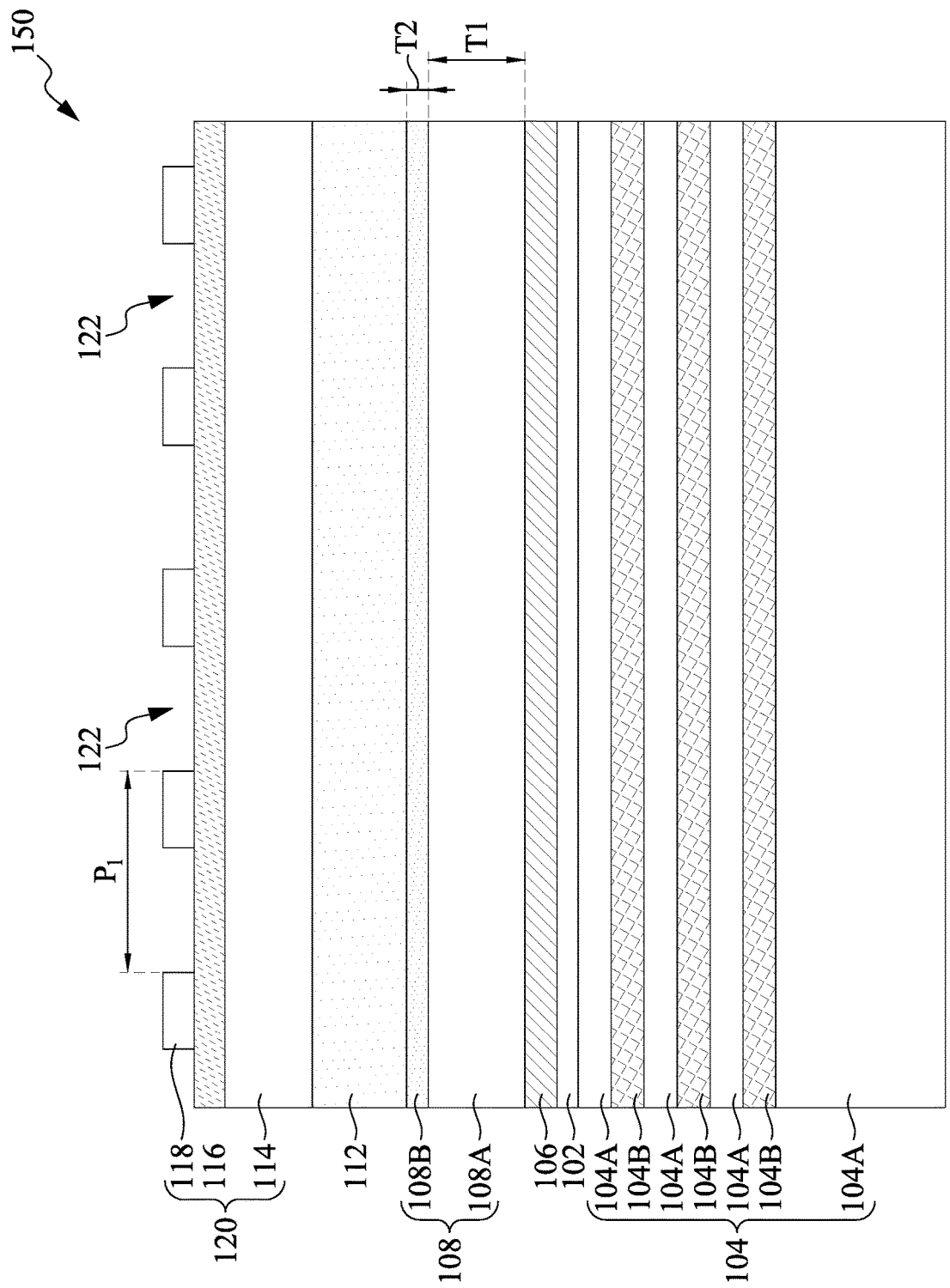
FIGS. 11 through 13 illustrate cross-sectional and perspective views of various intermediary stages of manufacturing a semiconductor device according to various other embodiments.

The target layer 104 in the above embodiments is a single layer of material. In other embodiments, the target layer 104 may have a multilayered structure. For example, FIGS. 10 and 11 illustrate another embodiment where the target layer 104 comprises alternating semiconductor layers 104A and 104B. The semiconductor layers 104A may comprise a first semiconductor material, and the semiconductor layers 104B may comprise a second semiconductor material that can be selectively etched compared to the first semiconductor material. For example, the semiconductor layers 104A may comprise silicon while the semiconductor layers 104B may comprise silicon germanium. The semiconductor layers 104B may be removed subsequently and the semiconductor layers 104A may be patterned to form channel regions of a nanostructure transistor device. In some embodiments, the nanostructure transistor can be a nanowire transistor, a nanosheet transistor, a gate all around transistor, or the like.

Figure 12:
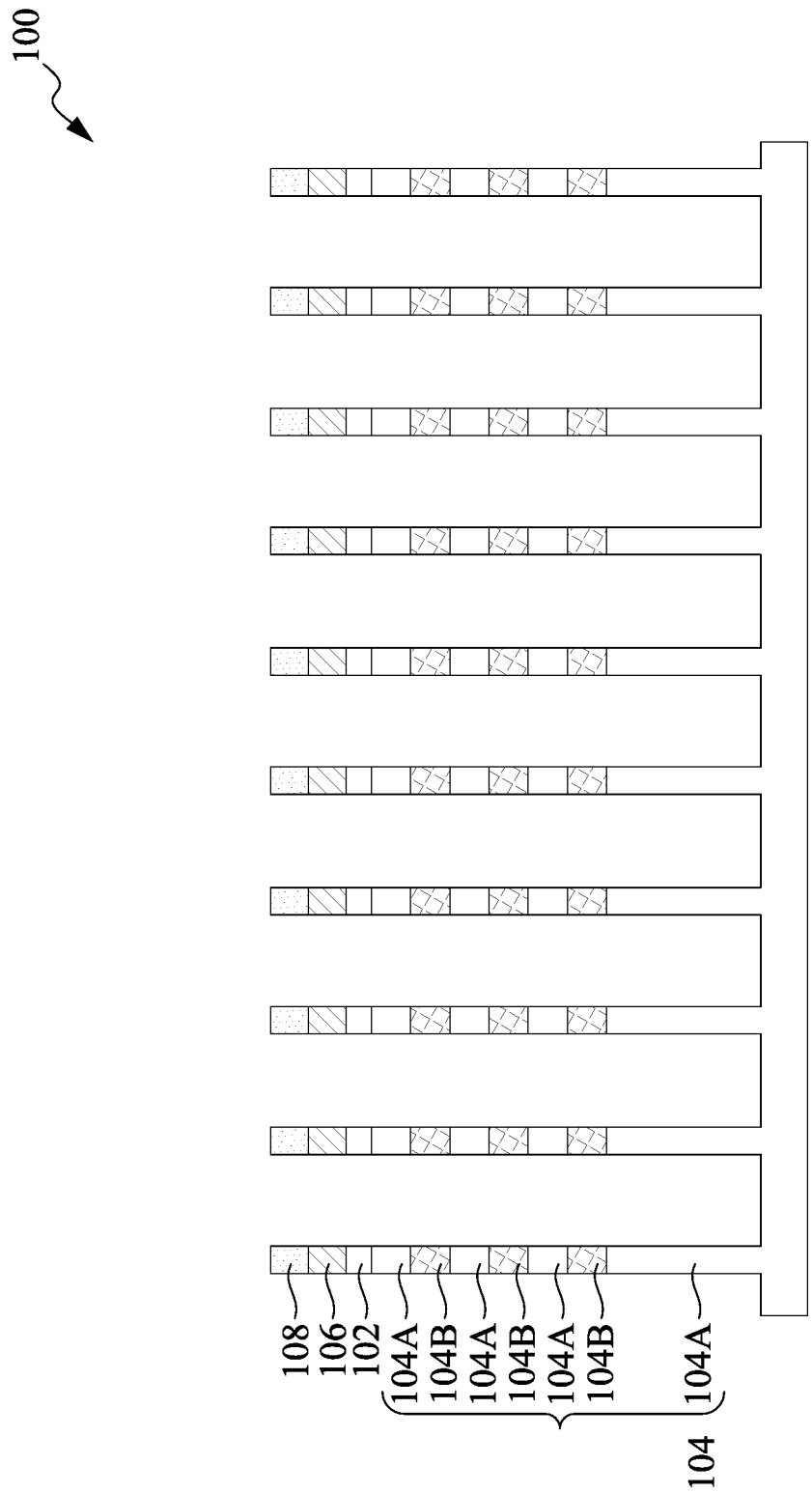

FIG. 11 illustrates an initial structure similar 150 similar to the structure 100 of FIG. 1 where like reference numerals indicate like elements formed using like processes. For example, a hard mask 108 may include a first hard mask layer 108A and a second hard mask layer 108B over the first hard mask layer 108A. The second hard mask layer 108A may be relatively dense. FIG. 12 illustrates an embodiment after the target layer (including the semiconductor layers 104A and 104B) is patterned to define fins using a similar process as described above with respect to FIGS. 1-8. Because the multilayered hard mask 108 is used, an improved profile can be achieved in the patterned target layer 104.

Additional process steps may be applied to structure 100 to form nanostructure transistor devices. For example, isolation regions may be deposited around the fins, and the isolation regions may then be recessed to expose upper portions of the fins. Openings may be patterned in the upper portions of the fins, and epitaxial source/drain regions maybe grown in the openings. Further, the semiconductor layers 104A may be removed, and the semiconductor layers 104B may be patterned to define channel regions. Bate structures may be formed around the channel regions.

Figure 13:
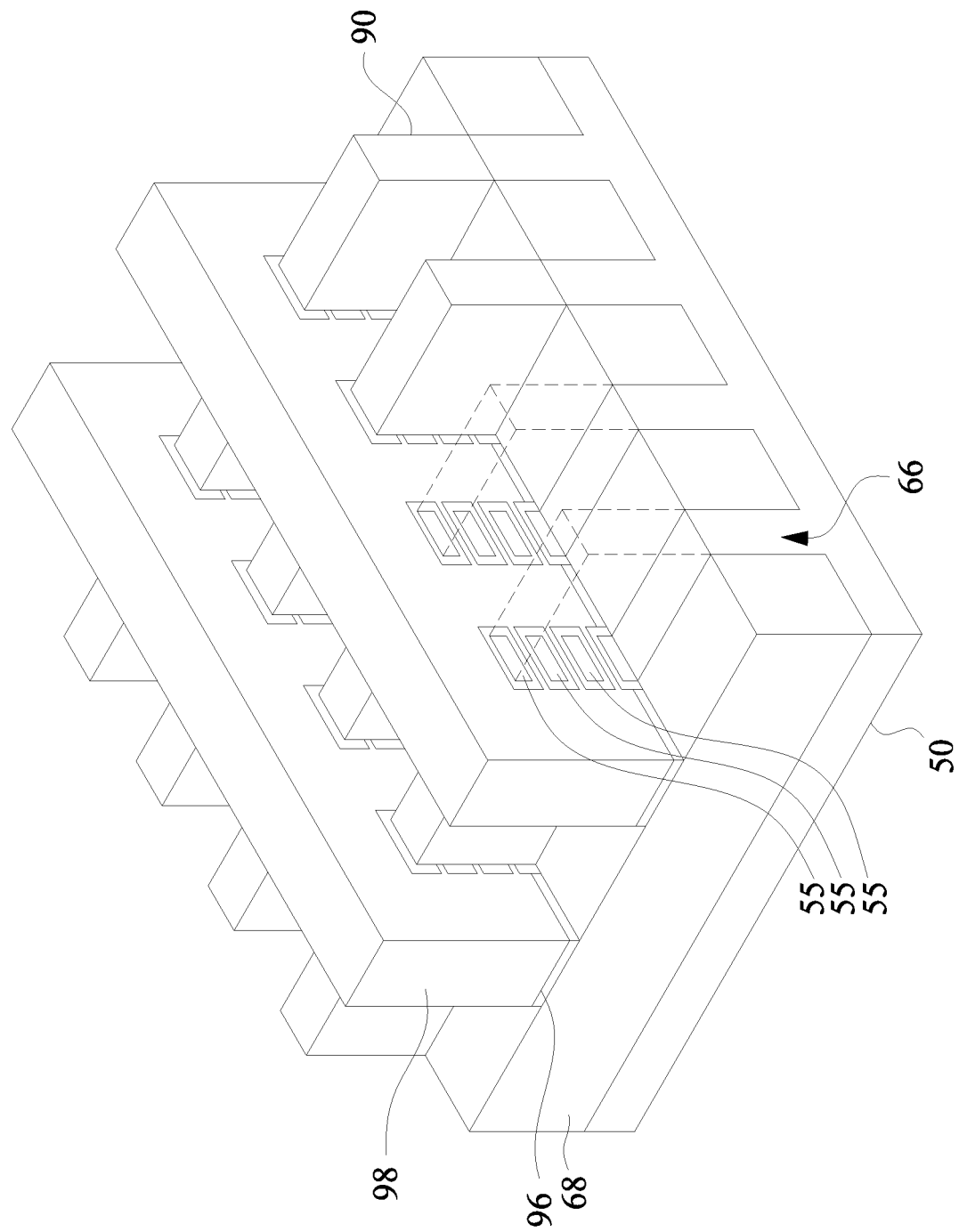

FIG. 13 illustrates an example of a nanostructure transistor in a three-dimensional view, in accordance with some embodiments. The nanostructure transistors comprise nanostructures 55 (e.g., nanosheets, nanowire, or the like) over fins on a substrate 50 (e.g., a semiconductor substrate), wherein the nano-structures 55 act as channel regions for the nanostructure transistors. The nanostructures 55 may be formed by patterning the semiconductor layers 104A. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 96 are over top surfaces of the fins 66 and along top surfaces, sidewalls, and bottom surfaces of the nano-structures 55. Gate electrodes 98 are over the gate dielectric layers 96. Epitaxial source/drain regions 90 are disposed on the fins 66 on opposing sides of the gate dielectric layers 96 and the gate electrodes 98.

Semiconductor devices and methods are provided in accordance with some embodiments. In particular, a self-aligned double patterning process is performed to pattern features (e.g., semiconductor fins, gate structures, conductive lines, or the like) into a target layer of in a semiconductor device. The patterned features have a pitch that is at least one half of a minimum pitch achievable using photolithographic processes. In various embodiments, a multilayered oxide is used as a hard mask over the target layer during the patterning process. The multilayered oxide hard mask may include a first oxide layer and a second oxide layer over the first oxide layer. A density of the second oxide layer may be greater than the first oxide layer. Advantages may be achieved using embodiment multilayered hard masks. For example, the relatively dense, second oxide layer may help reduce oxide loss during patterning and improve CD control. Further, in embodiments where the double patterning process is used to patterning semiconductor fins, reduced defects (e.g., less bending in the mask layer) and improved fin profile control (e.g., a more uniform profile) may also be achieved. Further, a less dense first oxide layer allows for reduced cost and increase yield due to the faster deposition time of the first oxide layer compared to the denser second oxide layer.

In some embodiments, a method includes depositing a hard mask over a target layer, wherein depositing the hard mask comprises: depositing a first hard mask layer having a first density; and depositing a second hard mask layer over the first hard mask layer, the second hard mask layer having a second density greater than the first density. The method further includes forming a plurality of mandrels over the hard mask; depositing a spacer layer over and along sidewalls of the plurality of mandrels; patterning the spacer layer to provide a plurality of spacers on the sidewalls of the plurality of mandrels; after patterning the spacer layer, removing the plurality of mandrels; transferring a pattern the plurality of spacers to the hard mask; and patterning the target layer using the hard mask as a mask. Optionally, in some embodiments, the first hard mask layer and the second hard mask layer each comprises silicon oxide. Optionally, in some embodiments, the first hard mask layer comprises silicon oxide, and wherein the second hard mask layer comprises silicon oxynitride, silicon oxycarbon nitride, or a combination thereof. Optionally, in some embodiments, depositing the second hard mask layer comprises depositing the second hard mask layer and the first hard mask layer in-situ. Optionally, in some embodiments, depositing the first hard mask layer comprises a chemical vapor deposition (CVD) process, and wherein depositing the second hard mask layer comprises an atomic layer deposition (ALD) process that is performed ex-situ of the CVD process. Optionally, in some embodiments, the first hard mask layer has a first thickness, wherein the second hard mask layer has a second thickness, and wherein a ratio of the second thickness to the first thickness is in a range of 1:6 to 1:4. Optionally, in some embodiments, the second thickness is in a range of about 50 Å to about 150 Å, and wherein the first thickness is in a range of about 400 Å to about 1000 Å. Optionally, in some embodiments, the target layer is a semiconductor substrate, and wherein patterning the target layer using the hard mask comprises patterning semiconductor fins in the semiconductor substrate.

In some embodiments, a method includes depositing a first oxide hard mask layer over a target layer; depositing a second oxide hard mask layer of the first oxide hard mask layer, wherein the second oxide hard mask layer has a greater density than the first oxide hard mask layer; depositing a mandrel layer over the second oxide hard mask layer; etching the mandrel layer to define a plurality of mandrels; forming spacers on sidewalls of the plurality of mandrels; removing the plurality of mandrels to define openings between the spacers; using the spacers as a mask to pattern the first oxide hard mask layer; and using the first oxide hard mask layer as a mask to pattern the target layer. Optionally, in some embodiments, removing the plurality of mandrels etches a recess into the second oxide hard mask layer. Optionally, in some embodiments, a depth of the recess is less than 3 nm. Optionally, in some embodiments, using the spacers as the mask to pattern the first oxide hard mask layer comprises removing the second oxide hard mask layer while patterning the first oxide hard mask layer. Optionally, in some embodiments, using the first oxide hard mask layer as the mask to pattern the target layer comprises removing upper portions of the first oxide hard mask layer. Optionally, in some embodiments, depositing the second oxide hard mask layer comprises depositing the second oxide hard mask layer in a same process chamber as depositing the first oxide hard mask layer. Optionally, in some embodiments, depositing the second oxide hard mask layer comprises depositing the second oxide hard mask layer in a different process chamber as depositing the first oxide hard mask layer.

In some embodiments, a method comprising: depositing a first oxide layer over a semiconductor layer and depositing a second oxide layer over the first oxide layer. The second oxide layer has a greater density than the first oxide layer, and the second oxide layer is thinner than the first oxide layer. The method further includes forming a plurality of mandrels over the second oxide layer; forming spacers on sidewalls of the plurality of mandrels; removing the plurality of mandrels to define openings between the spacers, wherein removing the plurality of mandrels etches recesses in the second oxide layer; using the spacers as a mask to pattern the first oxide layer; and using the first oxide layer as a mask to pattern the semiconductor layer. Optionally, in some embodiments, a ratio of a thickness of the second oxide layer to a thickness of the first oxide layer is in a range of 1:6 to 1:4. Optionally, in some embodiments, a respective depth of each of the recesses is less than 3 nm. Optionally, in some embodiments, the second oxide layer comprises silicon oxide, silicon oxynitride, silicon oxycarbon nitride, or a combination thereof. Optionally, in some embodiments, the second oxide layer completely covers the first oxide layer while removing the plurality of mandrels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a material layer;
   patterning the material layer, wherein patterning the material layer comprises:
   depositing a first hard mask layer over the material layer;
   depositing a second hard mask layer over the first hard mask layer, the second hard mask layer being denser than the first hard mask layer, the first hard mask layer and the second hard mask layer each comprising oxygen;
   forming a plurality of mandrels over the second hard mask layer;
   forming spacers on sidewalls of the plurality of mandrels;
   removing the plurality of mandrels;
   transferring a pattern of the spacers to the first hard mask layer; and
   etching the material layer using the first hard mask layer as a mask.

2. The method of claim 1, wherein the first hard mask layer and the second hard mask layer each comprises silicon oxide.

3. The method of claim 1, wherein the first hard mask layer comprises silicon oxide, and wherein the second hard mask layer comprises silicon oxynitride or silicon oxycarbon nitride.

4. The method of claim 1, wherein depositing the second hard mask layer comprises a performing a different type of deposition process as depositing the first hard mask layer.

5. The method of claim 1, wherein depositing the second hard mask layer comprises performing a same type of deposition process as depositing the first hard mask layer.

6. The method of claim 1, wherein the first hard mask layer has a first thickness, wherein the second hard mask layer has a second thickness, and wherein a ratio of the second thickness to the first thickness is in a range of 1:6 to 1:4.

7. The method of claim 1, wherein removing the plurality of mandrels comprises etching a recess in the second hard mask layer, the recess having a first depth, and wherein the second hard mask layer is deposited to a thickness greater than the first depth.

8. The method of claim 7, wherein the first depth is less than 3 nm.

9. The method of claim 1, wherein the second hard mask layer has a density of at least 1.8 g/cm$^3$.

10. A method comprising:
    depositing a first hard mask layer over a target layer, wherein the first hard mask layer comprises silicon oxide;
    depositing a second hard mask layer over and contacting the first hard mask layer, wherein a density of the second hard mask layer is at least 1.8 g/cm$^3$, wherein the second hard mask layer comprises silicon oxide, and wherein the second hard mask layer is thinner than the first hard mask layer, and wherein a density of the first hard mask layer is less than a density of the second hard mask layer;
    forming a plurality of mandrels over the second hard mask layer;
    forming spacers on sidewalls of the plurality of mandrels;
    removing the plurality of mandrels to define openings between the spacers;
    using the spacers as a mask to pattern the first hard mask layer; and
    using the first hard mask layer to pattern the target layer.

11. The method of claim 10, wherein the openings between the spacers extend into the second hard mask layer.

12. The method of claim 11, wherein a depth that the openings between the spacers extend into the second hard mask layer is less than 3 nm.

13. The method of claim 10, wherein using the spacers as the mask to pattern the first hard mask layer comprises consuming the second hard mask layer while patterning the first hard mask layer.

14. The method of claim 10, wherein depositing the second hard mask layer comprises depositing the second hard mask layer in a same process chamber as depositing the first hard mask layer.

15. The method of claim 10, wherein depositing the second hard mask layer comprises depositing the second hard mask layer in a different process chamber as depositing the first hard mask layer.

16. A method comprising:
   depositing a first oxide layer over a semiconductor layer;
   depositing a second oxide layer over and contacting the first oxide layer, wherein the second oxide layer is denser than the first oxide layer;
   forming a plurality of mandrels over the second oxide layer;
   forming spacers along sides of the plurality of mandrels;
   removing the plurality of mandrels;
   using the spacers as a mask to pattern the first oxide layer, wherein the second oxide layer is removed while patterning the first oxide layer; and
   using the first oxide layer as a mask to pattern a plurality of fins in the semiconductor layer.

17. The method of claim 16, wherein removing the plurality of mandrels partially etches the second oxide layer.

18. The method of claim 17, wherein removing the plurality of mandrels partially etches the second oxide layer to a depth of less than 3 nm.

19. The method of claim 16, wherein a density of the second oxide layer is at least 1.8 g/cm$^3$.

20. The method of claim 16, wherein the plurality of mandrels comprises amorphous silicon, wherein the first oxide layer comprises silicon oxide, and wherein the second oxide layer comprises silicon oxide, silicon oxynitride, or silicon oxycarbon nitride.

\* \* \* \* \*